(12) United States Patent
Sasaki et al.

(10) Patent No.: US 8,151,727 B2
(45) Date of Patent: Apr. 10, 2012

(54) PEROVSKITE-OXIDE FILM, PIEZOELECTRIC DEVICE, AND LIQUID DISCHARGE DEVICE

(75) Inventors: Tsutomu Sasaki, Kanagawa-ken (JP); Yukio Sakashita, Kanagawa-ken (JP)

(73) Assignee: FujiFilm Corporation, Tokyo (JP)

( * ) Notice: Subject to any disclaimer, the term of this patent is extended or adjusted under 35 U.S.C. 154(b) by 356 days.

(21) Appl. No.: 12/414,125

(22) Filed: Mar. 30, 2009

(65) Prior Publication Data

US 2010/0192842 A1 Aug. 5, 2010

(30) Foreign Application Priority Data

Feb. 4, 2009 (JP) .................................. 2009-023383

(51) Int. Cl.
 *C23C 14/00* (2006.01)
 *H01L 41/18* (2006.01)
 *H01L 41/187* (2006.01)
 *B41J 2/045* (2006.01)

(52) U.S. Cl. ..................... 118/50; 252/62.9 R; 347/68

(58) Field of Classification Search ............. 252/62.9 R, 252/62.9 PZ

See application file for complete search history.

(56) References Cited

U.S. PATENT DOCUMENTS

2007/0216734 A1* 9/2007 Kitamura et al. ............... 347/68

OTHER PUBLICATIONS

Zylberberg et al., " Bismuth Aluminate BiAlO$_3$: A New Lead-free High-T$_c$ Piezo-/ferroelectric", Proceedings of the 16th IEEE International Symposium on Applications of Ferroelectrics, Paper No. 28PS-B13, 2007.

Okada et al., "Synthesis of Bi(Fe$_x$Al$_{1-x}$)O$_3$ Thin Films by Pulsed Laser Deposition and Its Structural Characterization", Japanese Journal of Applied Physics, vol. 43, No. 9B, pp. 6609-6612, 2004.

* cited by examiner

*Primary Examiner* — Matthew Luu
*Assistant Examiner* — Lisa M Solomon
(74) *Attorney, Agent, or Firm* — Birch, Stewart, Kolasch & Birch, LLP

(57) ABSTRACT

A film formed on a substrate different from the monocrystalline perovskite substrate contains a piezoelectric oxide expressed as A(B$_x$C$_{1-x}$)O$_3$ other than Bi(Fe$_y$Sc$_{1-y}$)O$_3$ and Bi(Fe, Co)O$_3$, where 0<x<1.0, 0.5=y=0.9, A, B, and C are metallic elements, A represents one or more A-site elements including Bi as a main component, B represents one or more B-site elements including as a main component an element which can constitute a perovskite structure together with the one or more A-site elements represented by A, and C represents one or more B-site elements which are unable or hard to constitute a perovskite structure together with the one or more A-site elements represented by A.

32 Claims, 6 Drawing Sheets

PEROVSKITE-OXIDE FILM, PIEZOELECTRIC DEVICE, AND LIQUID DISCHARGE DEVICE

BACKGROUND OF THE INVENTION

1. Field of the Invention

The present invention relates to a perovskite-oxide film, a piezoelectric (ferroelectric) film, a piezoelectric (ferroelectric) device using the perovskite-oxide film, and a liquid discharge device using the piezoelectric device.

2. Description of the Related Art

Perovskite oxides are currently used in piezoelectric devices, switch devices, and the like since perovskite oxides exhibit ferroelectricity. For example, lead titanate zirconate (PZT) is known as a perovskite oxide exhibiting satisfactory piezoelectric characteristics. PZT is a ferroelectric material having spontaneous polarization even when no electric field is applied to PZT, and is reported to exhibit high piezoelectric performance at and near a morphotropic phase boundary (MPB).

However, currently, demands for higher piezoelectric performance and demands for lead-free piezoelectric materials (in consideration of the environmental load of the lead-containing materials) are increasing, and therefore development of new lead-free perovskite-oxide materials is proceeding.

In the process of development of lead-free perovskite oxide materials, some oxides having $ABO_3$ type composition and being theoretically considered to exhibit high piezoelectric performance are known to be actually incapable of being formed to have a perovskite crystal structure by high-temperature baking at normal pressure, but to be capable of being formed to have a perovskite crystal structure by baking at high pressure exceeding several GPa (gigapascal). For example, although the Bi-based oxides having $ABO_3$ type composition are theoretically considered to be lead-free piezoelectric materials exhibiting high piezoelectricity (ferroelectricity), most of the Bi-based oxides having $ABO_3$ type composition are hard or unable to be formed to have a perovskite crystal structure by high-temperature baking at normal pressure. Currently, $BiFeO_3$ is the only Bi-based perovskite oxide which can be formed into bulk ceramic at normal pressure. On the other hand, for example, $BiAlO_3$ can be formed into bulk ceramic having a perovskite crystal structure only by the synthesis at a temperature as high as 1000° C. and a pressure as high as 6 GPa. (See J. Zylberberg et al., "Bismuth Aluminate $BiAlO_3$: A New Lead-free High-$T_c$ Piezo-/ferroelectric", Proceedings of the 16th IEEE International Symposium on Applications of Ferroelectrics, Paper No. 28PS-B13, 2007.) However, baking at high pressure requires complex equipment and an uneasy process.

Further, in order to increase the mounting density of devices, downsizing of devices is currently being pursued. In particular, development of piezoelectric devices formed with thin films is proceeding. In order to realize the thin-film piezoelectric devices, films of perovskite oxides being able to be formed by sputtering, the sol-gel technique, CVD (chemical vapor deposition), or the like and having satisfactory element characteristics are currently being studied.

In the above circumstances, some attempts to form a thin film of a material having a perovskite crystal structure by sputtering or the like have been reported, where the material has been theoretically considered able to exhibit high ferroelectricity, and has been conventionally known to be unable or hard to be formed to have a perovskite crystal structure without use of a special technique such as high-pressure synthesis. However, films of many Bi-based oxides formed by themselves at normal pressure are hard to have a perovskite crystal structure with satisfactory crystallinity, although the characteristics of the films of the Bi-based oxides depend on the compositions of the Bi-based oxides. In order to overcome this problem, an attempt to form a thin film of a Bi-based oxide so as to have a perovskite crystal structure by producing a solid solution of the Bi-based oxide and $BiFeO_3$ has been reported, where the Bi-based oxide is known to be unable to be formed to have a perovskite crystal structure without being baked at high pressure, and $BiFeO_3$ is known to be able to be easily formed into a thin film having a perovskite crystal structure by bulk baking at normal pressure. M. Okada et al. (in "Synthesis of $Bi(Fe_xAl_{1-x})O_3$ Thin Films by Pulsed Laser Deposition and Its Structural Characterization", Japanese Journal of Applied Physics, Vol. 43, No. 9B, pp. 6609-6612, 2004) report that films of $Bi(Fe, Al)O_3$ each having a perovskite crystal structure are formed on perovskite substrates of $SrTiO_3$ by producing solid solutions of 0 to 50% $BiAlO_3$ in $BiFeO_3$.

The films of $Bi(Fe, Al)O_3$ reported in the Okada reference are formed on monocrystalline perovskite substrates. Nevertheless, from the viewpoint of the cost and versatility, it is desirable that perovskite-oxide films can be formed on substrates other than the monocrystalline perovskite substrate, and it is particularly desirable that perovskite-oxide films can be formed on silicon substrates, which are especially versatile.

SUMMARY OF THE INVENTION

The present invention has been made in view of the above circumstances.

The first object of the present invention is to provide a film of a lead-free perovskite oxide being formed on a substrate other than the monocrystalline perovskite substrate, containing a Bi-based oxide which is unable or hard to be formed to have a perovskite structure at normal pressure, and being superior in piezoelectric (ferroelectric) characteristics.

The second object of the present invention is to provide a piezoelectric film containing an oxide which is theoretically considered able to exhibit high piezoelectricity and has been conventionally unable to be formed to have a perovskite structure at normal pressure.

The third object of the present invention is to provide a piezoelectric device using the piezoelectric film achieving the second object.

The fourth object of the present invention is to provide a liquid discharge device using the above piezoelectric device achieving the third object.

In order to accomplish the first object, a film (perovskite-oxide film) according to the first aspect of the present invention is provided. The film (perovskite-oxide film) according to the first aspect of the present invention is formed on a substrate having a structure different from the monocrystalline perovskite structure, and contains a piezoelectric oxide having a composition expressed by the compositional formula, $$A(B_xC_{1-x})O_3, \quad (P1)$$

other than $Bi(Fe_ySc_{1-y})O_3$ and $Bi(Fe, Co)O_3$, where $0<x<1.0$, $0.5=y=0.9$, each of A, B, and C represents one or more metallic elements, A represents one or more A-site elements including Bi as a main component, B represents one or more B-site elements including as a main component one or more elements which can constitute a perovskite structure together with the one or more A-site elements represented by A, C represents one or more B-site elements which are unable or hard to constitute a perovskite structure together with the one or more A-site elements represented by A, and the ratio of each of the total molar amount of the one or more A-site elements and the total molar amount of the B-site elements to the molar amount of oxygen may deviate from 1:3 within a range in which the composition expressed by the compositional formula $A(B_xC_{1-x})O_3$ can form a perovskite structure.

In addition, in order to accomplish the first object, a film (perovskite-oxide film) according to the second aspect of the present invention is also provided. The film (perovskite-oxide film) according to the second aspect of the present invention is formed on a substrate having a structure different from the monocrystalline perovskite structure, has an epitaxial or oriented structure, and contains a piezoelectric oxide having a composition expressed by the compositional formula, $$A(B_xC_{1-x})O_3, \qquad (P2)$$

where $0<x<1.0$, each of A, B, and C represents one or more metallic elements, A represents one or more A-site elements including Bi as a main component, B represents one or more B-site elements including as a main component one or more elements which can constitute a perovskite structure together with the one or more A-site elements represented by A, C represents one or more B-site elements which are unable or hard to constitute a perovskite structure together with the one or more A-site elements represented by A, and the ratio of each of the total molar amount of the one or more A-site elements and the total molar amount of the B-site elements to the molar amount of oxygen may deviate from 1:3 within a range in which the composition expressed by the compositional formula $A(B_xC_{1-x})O_3$ can form a perovskite structure.

In this specification, the term "main component" means a component the content of which is 80 mol % or higher.

From the viewpoint of the electrical neutrality, the B-site elements represented by B and C are normally trivalent elements. However, the valences of the B-site elements represented by B and C may deviate from three as long as the composition expressed by the compositional formula $A(B_xC_{1-x})O_3$ can form a perovskite structure.

In addition, in this specification, the term "unable or hard to constitute a perovskite structure" means that when a sintered body is produced by solid-phase sintering at normal pressure, a perovskite structure cannot be formed or a (hetero) phase other than the perovskite structure is observed. At this time, the perovskite structure is evaluated by X-ray diffraction (XRD). In the XRD measurement, for example, $2\theta/\omega$ scanning ($\theta$-$2\theta$ scanning) is performed in a common manner by use of the Ultima III X-ray diffractometer (which is available from Rigaku Corporation), where a standard Cu tube is used, and specimens are prepared to have a thickness of approximately 500 nm. Details of an exemplary measurement condition are indicated in Table 1.

TABLE 1

| Goniometer | Ultima III In-plane |
|---|---|
| Attachment | Thin-film-Specimen Table |
| Scanning Mode | 2θ/Omega |
| Scanning Type | Continuous Scanning |
| X-Ray | 40 kV/40 mA |
| Attenuator | Open (Normally Open, but 1/10 when Intensity is too High.) |
| Dispersion Slit DS | 1.00 mm |
| Scattering Slit SS | Open |
| Reception Slit RS | Open |
| Vertical Dispersion Limitation Slit | 10 mm |
| Incident Soller | V5 |

TABLE 1-continued

| Reception Soller | PSA |
|---|---|
| Sampling Step | 0.005 |
| Scanning Speed | 4.0 degrees/min |

Preferably, the films according to the first and second aspects of the present invention may further have one or any possible combination of the following additional features (i) to (viii).

(i) The films according to the first and second aspects of the present invention may be formed over the substrate via one of one or more buffer layers and a lower electrode which enable epitaxial growth of the film on the one of the buffer layer and the lower electrode.

(ii) The one or more B-site elements represented by B may include as at least one main component at least one of Fe, Mn, and Cr.

(iii) The one or more B-site elements represented by C may include as at least one main component at least one trivalent metallic element. In this case, it is more preferable that the one or more B-site elements represented by C be one or more of Al, Ga, Sc, and Co.

(iv) The films according to the first and second aspects of the present invention may further contain such an amount of atoms of one or more dopant elements of Mn, Cu, and Nb that the film can have a perovskite structure.

(v) The films according to the first and second aspects of the present invention can have a composition at or near a morphotropic phase boundary (MPB).

In this specification, the expression "at or near a morphotropic phase boundary (MPB)" means that the composition of a substance is in a range of the composition in which the phase of the substance transitions when an electric field is applied to the substance.

(vi) The films according to the first and second aspects of the present invention may be a ferroelectric film such as a piezoelectric film. In this case, the film contains a ferroelectric phase which has crystal orientation, and the piezoelectric film achieves the aforementioned second object.

In this specification, the expression "having crystal orientation" means that the degree F of orientation measured by the Lotgerling technique is 80% or higher. The degree F of orientation defined as

$$F(\%)=(P-P0)/(1-P0)\times 100,$$

where P is the ratio of the total XRD (X-ray diffraction) intensity from an orientation plane to the total XRD intensity from all the crystal planes, and P0 is the value of P in the case where the sample is completely randomly oriented. In the case of the (001) orientation, $P=\Sigma I(001)/\Sigma I(hkl)$, where I(hkl) is the XRD intensity from the crystal plane (hkl), $\Sigma I(001)$ is the total XRD intensity from the crystal plane (001), and $\Sigma I(hkl)$ is the total XRD intensity from all the crystal planes (hkl). For example, in the case of the (001) orientation in a perovskite crystal, $P=I(001)/\{I(001)+I(100)+I(101)+I(110)+I(111)\}$. When the sample is completely randomly oriented, F=0%. When the sample is completely oriented, F=100%.

(vii) The films according to the first and second aspects of the present invention may contain at least one ferroelectric phase, where each of the at least one ferroelectric phase has a spontaneous polarization axis along a first direction and crystal orientation along a second direction different from the first direction. In this case, it is more preferable that each of the at least one ferroelectric phase be at least one of a rhombohedral phase having crystal orientation along approximately a <100> direction, a rhombohedral phase having crystal orientation along approximately a <110> direction, a tetragonal phase having crystal orientation along approximately a <110> direction, a tetragonal phase having crystal orientation along approximately a <111> direction, an orthorhombic phase having crystal orientation along approximately a <100> direction, and an orthorhombic phase having crystal orientation along approximately a <111> direction.

In this specification, the expression "having crystal orientation along approximately the <abc> direction" means that the degree F of orientation along the <abc> direction is 80% or higher.

(viii) In the films according to the first and second aspects of the present invention having the feature (vii), at least a portion of each of the at least one ferroelectric phase may transition to a ferroelectric phase corresponding to a crystal system different from a crystal system corresponding to the ferroelectric phase, when an electric field is applied to the piezoelectric body along a direction different from the first direction.

In order to accomplish the third object, a piezoelectric device according to the third aspect of the present invention is provided. The piezoelectric device according to the third aspect of the present invention comprises: the film according to the first or second aspect of the present invention as a piezoelectric film; and electrodes arranged to apply an electric field to the piezoelectric film.

In order to accomplish the fourth object, a liquid discharge device according to the fourth aspect of the present invention is provided. The liquid discharge device according to the fourth aspect of the present invention comprises: the piezoelectric device according to the third aspect of the present invention; and a discharge member being arranged adjacent to the piezoelectric device, where the discharge member includes a liquid-reserve chamber which reserves liquid, and a liquid-discharge outlet arranged to externally discharge the liquid in response to application of an electric field to the piezoelectric film in the piezoelectric device.

Japanese Unexamined Patent Publication No. 2005-039166 (which is hereinafter referred to as JP2005-039166A) discloses a piezoelectric device in which a piezoelectric film of $BiFeO_3$ is arranged on a monocrystalline substrate of silicon. In the piezoelectric device disclosed in JP2005-039166A, in order to improve the magnetic properties and the leakage characteristics, part (1 to 10%) of the B-site elements are substituted with one or more magnetic metallic elements so that the one or more magnetic metallic elements are solid solved, or part (1 to 30%) of the B-site elements are substituted with one or more metallic elements having a greater valence than Fe so that the one or more metallic elements are solid solved. However, JP2005-039166A does not report that the $BiFeO_3$ film which is doped with the one or more metallic elements as above has been actually produced. Therefore, it is unknown whether or not the above $BiFeO_3$ film has a perovskite structure and what piezoelectric characteristics the above $BiFeO_3$ film has.

In addition, S. Yasui et al. (in "Preparation and Characterization of Bi-provskite Oxide Films for Piezo Applications," Proceedings of the 16th IEEE International Symposium on Applications of Ferroelectrics, Paper No. 28PS-A-28, 2007 which is hereinafter referred to as the first Yasui reference) report formation of a $Bi(Fe, Co)O_3$ film on a $Pt/Ti/SiO_2/Si$ substrate. The first Yasui reference further reports that when the amount of the doped Co is 30% or more, the $Bi(Fe, Co)O_3$ film contains a hetero phase, and the electric characteristics greatly deteriorate.

Further, S. Yasui et al., "Formation of $BiFeO_3$—$BiScO_3$ Thin Films and Their Electrical Properties," Japanese Journal of Applied Physics, Vol. 45, No. 9B, pp. 7321-7324, 2006 (which is hereinafter referred to as the second Yasui reference) and S. R. Shannigrahi et al., "Sc Modified Multiferroic $BiFeO_3$ thin films prepared through a sol-gel process," Applied Physics Letters, Vol. 90, 022901, 2007 (which is hereinafter referred to as the Shannigrahi reference) report formation, on a Si substrate, of $Bi(Fe, Sc)O_3$ films having a perovskite structure and being formed by doping $BiFeO_3$ with 10 mol %, 30 mol %, and 50 mol % $BiScO_3$ for improvement in the leakage characteristics of $BiFeO_3$. The second Yasui reference and the Shannigrahi reference report that a hetero phase (which is not a single-phase perovskite phase) is observed in the $Bi(Fe, Sc)O_3$ films which are doped with 50 mol % Sc in the B sites. That is, the amount of the doped Sc reported in the second Yasui reference or the Shannigrahi reference is insufficient for achieving satisfactory leakage characteristics and satisfactory ferroelectricity.

Furthermore, the Bi-based perovskite oxides disclosed in JP2005-039166A, the first and second Yasui references, and the Shannigrahi reference are randomly oriented (i.e., exhibit low crystal orientation), so that it is impossible to expect that the disclosed Bi-based perovskite oxides exhibit high piezoelectricity.

As described before, the films according to the present invention are lead-free perovskite-oxide films containing a Bi-based oxide which is unable or hard to form a perovskite structure, and exhibiting superior ferroelectric (piezoelectric) performance. Therefore, the films according to the present invention are different from the films of the Bi-based perovskite oxides disclosed in JP2005-039166A, the first and second Yasui references, and the Shannigrahi reference.

In addition, the films of the Bi-based perovskite oxides disclosed in JP2005-039166A, the first and second Yasui references, and the Shannigrahi reference are produced by substituting one or more dopant elements for part of Fe atoms in a $BiFeO_3$ film having a perovskite structure so that the one or more dopant elements are solid solved. On the other hand, according to the present invention, a film of a solid solution of $BiFeO_3$ and a Bi-based oxide which is unable or hard to form a perovskite structure is produced so that the solid solution forms a perovskite structure. However, JP2005-039166A, the first and second Yasui references, and the Shannigrahi reference do not disclose or imply the production of the solid solution according to the present invention.

In the films according to the first and second aspects of the present invention, a perovskite structure is realized by producing a solid solution of an oxide which can be easily formed into a thin film having a perovskite structure and a Bi-based oxide which is theoretically considered able to form a perovskite structure superior in the piezoelectric (ferroelectric) performance and is unable or hard to form a perovskite structure by itself at normal pressure. Therefore, according to the present invention, it is possible to provide a lead-free (Bi-based) perovskite-oxide film which is superior in the piezoelectric (ferroelectric) performance.

DETAILED DESCRIPTION OF THE INVENTION

Figure 1:
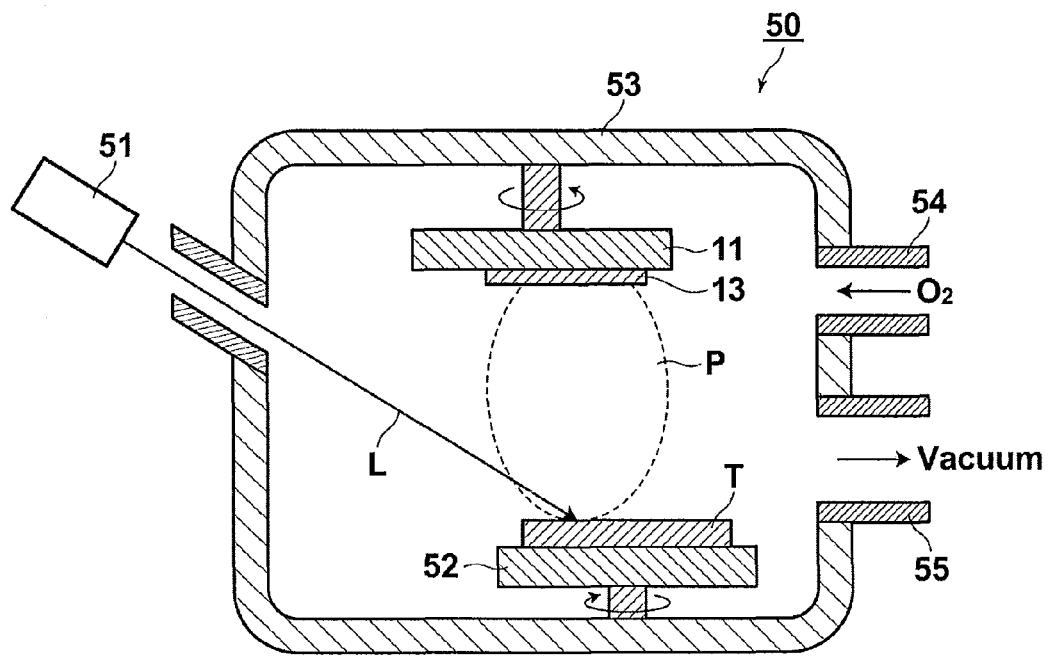
FIG. 1 is a cross-sectional view schematically illustrating a cross section of a pulsed-laser deposition system.

Preferred embodiments of the present invention are explained in detail below with reference to drawings.

1. Perovskite-Oxide Film

The present invention realizes a novel Bi-based perovskite-oxide film by producing a solid solution of a Bi-based oxide which can be easily formed into a thin film having a perovskite structure and a Bi-based oxide which is theoretically considered able to form a perovskite structure superior in the piezoelectric (ferroelectric) performance and is unable or hard to form a perovskite structure by itself at normal pressure.

In this specification, the term "normal pressure" means the pressure in the range including the vicinity of the atmospheric pressure and the pressure range in which the formation of thin films are normally formed. The techniques for forming thin piezoelectric films are roughly classified into the vapor phase techniques and the liquid phase techniques, where the vapor phase techniques include sputtering, pulsed-laser deposition (PLD), chemical vapor deposition (CVD), and the like, and the liquid phase techniques include the sol-gel technique and the like. The range of pressures commonly used in the vapor phase techniques is approximately $10^{-4}$ to $10^3$ Pa ($7.6\times10^{-4}$ mTorr to $7.6\times10^3$ mTorr), and the pressure commonly used in the liquid phase techniques is the atmospheric pressure (approximately $10^5$ Pa (760 Torr)).

As mentioned before, the Okada reference discloses that Bi(Fe, Al)$O_3$ films each having a perovskite structure are obtained by producing a solid solution of $BiFeO_3$ (which can be formed into a perovskite structure by bulk baking or thin-film formation at normal pressure) and a Bi-based oxide which is unable or hard to form a perovskite crystal structure by itself at normal pressure. However, all the Bi(Fe, Al)$O_3$ films reported in the Okada reference are formed on a monocrystalline perovskite substrate. It is possible to consider that in the case where the layer underlying a film of a perovskite oxide to be formed over a substrate (e.g., the substrate per se) has a perovskite structure, the film of the perovskite oxide best lattice matches with the substrate, and the formation of the perovskite oxide into a perovskite structure is greatly facilitated.

On the other hand, the present inventors have succeeded in forming a novel Bi-based perovskite-oxide film on a substrate other than the monocrystalline perovskite substrate, where the novel Bi-based perovskite-oxide film contains a Bi-based oxide which is unable or hard to form a perovskite structure by itself at normal pressure. The usableness of various types of substrates according to the present invention is greatly advantageous in order to increase the freedom of design and control of various properties for reducing stress caused by the difference in thermal expansion coefficient between the film and the substrate, or preventing cracks produced by the difference.

As described before, the film according to the first aspect of the present invention is formed on a substrate having a structure different from the monocrystalline perovskite structure, and contains a piezoelectric oxide having a composition expressed by the compositional formula, $$A(B_xC_{1-x})O_3, \quad (P1)$$

other than $Bi(Fe_yS c_{1-y})O_3$ and Bi(Fe, Co)$O_3$, where $0<x<1.0$, $0.5 \leq y \leq 0.9$, each of A, B, and C represents one or more metallic elements, A represents one or more A-site elements including Bi as a main component, B represents one or more B-site elements including as a main component one or more elements which can constitute a perovskite structure together with the one or more A-site elements represented by A, C represents one or more B-site elements which are unable or hard to constitute a perovskite structure together with the one or more A-site elements represented by A, and the ratio of each of the total molar amount of the one or more A-site elements and the total molar amount of the B-site elements to the molar amount of oxygen may deviate from 1:3 within a range in which the composition expressed by the compositional formula $A(B_xC_{1-x})O_3$ can form a perovskite structure.

In addition, the film according to the second aspect of the present invention is formed on a substrate having a structure different from the monocrystalline perovskite structure, has an epitaxial or oriented structure, and contains a piezoelectric oxide having a composition expressed by the compositional formula, $$A(B_xC_{1-x})O_3, \quad (P2)$$

where $0<x<1.0$, each of A, B, and C represents one or more metallic elements, A represents one or more A-site elements including Bi as a main component, B represents one or more B-site elements including as a main component one or more elements which can constitute a perovskite structure together with the one or more A-site elements represented by A, C represents one or more B-site elements which are unable or hard to constitute a perovskite structure together with the one or more A-site elements represented by A, and the ratio of each of the total molar amount of the one or more A-site elements and the total molar amount of the B-site elements to the molar amount of oxygen may deviate from 1:3 within a range in which the composition expressed by the compositional formula $A(B_xC_{1-x})O_3$ can form a perovskite structure.

As mentioned before, the perovskite structure in each of the films according to the first and second aspects of the present invention is realized by producing a solid solution of a Bi-based perovskite oxide which can be easily formed into a thin film having a perovskite structure and a Bi-based oxide which is unable or hard to form a perovskite structure by itself at normal pressure.

Although the substrate used in formation of each of the films according to the first and second aspects of the present invention is not specifically limited (as long as the substrate is different from the monocrystalline perovskite substrate), it is preferable that the substrate is made of a material which well lattice matches with the film to be formed. When the substrate lattice matches so well with the film to be formed that the film can epitaxially grow, the films according to the first and second aspects of the present invention can become epitaxial films having similar crystal orientation to the substrate. For example, in the case where a film of $BiXO_3$ is formed on a (001) face of a substrate so that the (001) face of $BiXO_3$ lattice matches with the (001) face of the substrate, the condition for realizing the epitaxial growth of the film of $BiXO_3$ is that the value of nCs/mC falls within the range of 0.95 to 1.05, where Cs is the lattice constant of the substrate, C is the lattice constant of $BiXO_3$, and each of n and m is 1 to 5.

In addition, it is possible to arrange over the substrate one or more buffer layers and/or a lower electrode which can realize satisfactory lattice matching. Pt/Ti/Si, $Pt/TiO_2/Si$, $Pt/Ti/SiO_2/Si$, $Pt/TiO_2/SiO_2/Si$, $SrRuO_3/MgO/Si$, $SrRuO_3/YSZ/CeO_2/Si$, $SrRuO_3/MgO$, and Pt/Ti/MgO are examples of combinations of a buffer layer and the like and a substrate which lattice match well with Bi-based oxides and enable formation of an epitaxial or oriented film. However, the Si substrate is preferable from the viewpoint of versatility and workability.

The perovskite oxides having the compositions expressed by the compositional formulas (P1) and (P2) are composite oxides each of which is composed of first and second types of Bi-based oxides ($BiBO_3$ and $BiCO_3$), where the first type of Bi-based oxide ($BiBO_3$) can be formed into a thin film having a perovskite structure, and the second type of Bi-based oxide ($BiCO_3$) is theoretically considered able to form a perovskite structure superior in the ferroelectric performance and is unable or hard to form a perovskite structure by itself at normal pressure.

The one or more A-site elements in the perovskite oxides having the compositions expressed by the compositional formulas (P1) and (P2) contain Bi as a main component in the A sites. That is, the one or more A-site elements in the perovskite oxides having the compositions expressed by the compositional formulas (P1) and (P2) may be Bi only, or part of Bi atoms in the A sites may be substituted with atoms of one or more other elements. Since Bi is trivalent, it is preferable that the one or more substitute elements be also trivalent. For example, Nd and the like are preferable substitute elements.

Although the first type of Bi-based oxide ($BiBO_3$) (which can be formed into a thin film having a perovskite structure) is not specifically limited, it is preferable that the one or more B-site elements represented by B include as at least one main component at least one of Fe, Mn, and Cr. From the viewpoint of electrical neutrality, it is preferable that the one or more B-site elements represented by B be one or more trivalent elements. In particular, $BiFeO_3$ can form a perovskite structure even by normal-pressure bulk baking, and therefore $BiFeO_3$ can be easily formed into a thin film having a perovskite structure.

The second type of Bi-based oxide ($BiCO_3$) (which is theoretically considered able to form a perovskite structure superior in the ferroelectric performance and is unable or hard to form a perovskite structure by itself at normal pressure) is not specifically limited. However, from the viewpoint of electrical neutrality, it is preferable that the one or more B-site elements represented by C include one or more trivalent elements. Nevertheless, the one or more B-site elements represented by C may include one or more elements having more than one different valence as long as the perovskite oxide having the composition expressed by the compositional formula (P1) or (P2) can form a perovskite structure. Further, it is preferable that the one or more B-site elements represented by C be one or more of Al, Ga, Sc, and Co.

The present inventors have proposed a process for producing a perovskite oxide on the basis of a novel principle for material design of a perovskite oxide exhibiting satisfactory piezoelectric performance, and perovskite oxides produced by the process, in the International Patent Application No. PCT/JP2008/051020, which is published as the International Patent Publication No. WO/2008/088086 (hereinafter referred to as WO/2008/088086), and is based on the Japanese Patent Application No. 2007-010185. WO/2008/088086 discloses that it is possible to produce a lead-free perovskite oxide which has approximately an MPB composition containing Bi as a main component in the A sites, and exhibits superior piezoelectric characteristics. However, the present invention broadly presents piezoelectric films having compositions which are not limited to the MPB composition, and realize a perovskite structure regardless of the piezoelectric performance. As described in the "Description of the Related Art," although it depends on the composition, it is hard for many oxides having the $ABO_3$ type composition and containing Bi as a main component in the A sites to form, by themselves at normal pressure, a perovskite structure having satisfactory crystallinity. The novel Bi-based oxides presented by WO/2008/088086 also tend to have the above difficulty. According to the present invention, it is possible to realize a perovskite structure by producing a solid solution of a Bi-based oxide which is unable or hard to form a perovskite structure by itself at normal pressure and a Bi-based oxide which can be easily formed to have a perovskite structure (e.g., $BiFeO_3$). Therefore, according to the present invention, it is possible to produce a novel Bi-based perovskite-oxide film containing a Bi-based perovskite oxide which is theoretically considered able to exhibit high piezoelectricity and has been conventionally hard to produce because the Bi-based perovskite oxide is unable or hard to be formed by itself to have a perovskite structure.

In the compositional formulas (P1) and (P2), it is sufficient that the mole fraction x of Bi-based oxide $ABO_3$ which can be easily formed into a thin film having a perovskite structure be in the range between 0 and 1.0. In particular, it is preferable that the mole fraction x of Bi-based oxide $ABO_3$ satisfy the inequalities $0.1=x<1.0$. In the case where the one or more B-site elements are Fe, i.e., in the case where the Bi-based oxide $ABO_3$ which can be easily formed into a thin film having a perovskite structure is $BiFeO_3$, from the viewpoint of the leakage characteristics, it is more preferable that the mole fraction x of $BiFeO_3$ be smaller. In this case, from the viewpoint of improvement of the leakage characteristics, it is preferable that the perovskite oxides having the compositions expressed by the compositional formulas (P1) and (P2) be doped with a very small amount of Mn. Further, the perovskite oxides having the compositions expressed by the compositional formulas (P1) and (P2) may be doped with one or more transition elements (e.g., Co, Cu, and Nb) as far as the perovskite oxides having the compositions expressed by the compositional formulas (P1) and (P2) can form a perovskite structure.

According to the present invention, the phase structure of each of the perovskite oxides expressed by the compositional formulas (P1) and (P2) is not specifically limited. For example, the perovskite oxides may have a two-phase mixed-crystal structure in which the respective components of the perovskite oxide coexist, or a single-phase structure in which the respective components of the perovskite oxide are completely solid solved into a single phase, or another structure.

In the case where the perovskite oxides according to the present invention are used in a piezoelectric film, it is preferable that the perovskite oxides have a two-phase mixed-crystal structure in which the respective components of the perovskite oxide coexist. For example, in the case where the one or more B-site elements in the compositional formulas (P1) and (P2) are Fe, the Bi-based oxide $BiCO_3$ is preferably such that the most stable crystal system is not the rhombohedral crystal system, since the most stable crystal system of $BiFeO_3$ is the rhombohedral crystal system. In the case where the perovskite oxides expressed by the compositional formulas (P1) and (P2) have a two-phase mixed-crystal structure in which the respective components of the perovskite oxide coexist, the perovskite oxides have composition at or near an MPB (morphotropic phase boundary). For example, on the basis of an investigation made by the present inventors, the present inventors conjecture that the most stable crystal system of $BiAlO_3$ (in which the one or more B-site elements represented by C are Al) is the tetragonal crystal system. Therefore, it is possible to consider that the compositions of the perovskite oxides expressed by the compositional formulas (P1) and (P2) can be arranged at or near an MPB in the case where the Bi-based oxide $BiBO_3$ is $BiFeO_3$ and the Bi-based oxide $BiCO_3$ is $BiAlO_3$.

The piezoelectric materials are reported to exhibit high piezoelectric performance at and near an MPB. In particular, in the piezoelectric body utilizing phase transition induced by an electric field as proposed and explained in detail in Japanese Unexamined Patent Publication No. 2007-116091 (which corresponds to the International Patent Publication No. WO/2007/034903), the phases of at least portions of the piezoelectric body transition from a first ferroelectric phase corresponding to a first crystal system to a second ferroelectric phase corresponding to a second crystal system different from the first crystal system when an electric field is applied to the piezoelectric body. Therefore, it is possible to achieve greater piezoelectric gain.

Preferably, the crystal orientation of each ferroelectric phase which transitions is along a direction different from the orientation of the spontaneous polarization axis in the ferroelectric phase, and particularly preferably, the crystal orientation is approximately identical to the orientation of the spontaneous polarization axis after the phase transition. When the direction of the applied electric field is approximately identical to the orientation of the spontaneous polarization axis after the phase transition, the engineered-domain effect can work before the phase transition, so that the phase transition efficiently proceeds and the part of the ferroelectric phase which remains without the phase change is reduced. In addition, when the direction of the applied electric field is approximately equal to the orientation of the spontaneous polarization axis after the phase transition, the conventional piezoelectric effect can effectively work after the phase transition, so that it is possible to stably achieve great displacement. The engineered-domain effect in a monocrystal is explained by S. E. Park et al., "Ultrahigh strain and piezoelectric behavior in relaxor based ferroelectric single crystals," Journal of Applied Physics, Vol. 82, pp. 1804-1811, 1997.

Consequently, in the case where the films according to the present invention are used as piezoelectric films, it is preferable that the perovskite oxides expressed by the compositional formulas (P1) and (P2) have compositions at or near an MPB (which is preferable for the piezoelectric body utilizing phase transition induced by an electric field), and contain a ferroelectric phase having crystal orientation. In addition, it is preferable that the ferroelectric phase in which the phase transition occurs have crystal orientation along a direction which is different from the orientation of the spontaneous polarization axis before the phase transition, and it is particularly preferable that the ferroelectric phase have crystal orientation along a direction which is identical to the orientation of the spontaneous polarization axis after the phase transition.

The spontaneous polarization axis of the ferroelectric material is <001> in the tetragonal system, <110> in the orthorhombic system, and <111> in the rhombohedral system. It is possible to equalize the direction of the electric field applied to the piezoelectric body with the spontaneous polarization axis after the phase transition when the ferroelectric phase of each component in which phase transition occurs is one of the rhombohedral phase having crystal orientation along approximately the <100> direction, the rhombohedral phase having crystal orientation along approximately the <110> direction, the tetragonal phase having crystal orientation along approximately the <110> direction, the tetragonal phase having crystal orientation along approximately the <111> direction, the orthorhombic phase having crystal orientation along approximately the <100> direction, and the orthorhombic phase having crystal orientation along approximately the <111> direction.

Further, in the case where the films according to the present invention are used in ferroelectric memories, it is preferable that the films according to the present invention be ferroelectric films exhibiting an electric field-strain hysteresis with satisfactory squareness.

2. Production of Perovskite-Oxide Film

The films according to the present invention can be formed, for example, by pulsed-laser deposition (PLD) or the like. FIG. 1 is a cross-sectional view schematically illustrating a cross section of a common pulsed-laser deposition system 50. In the pulsed-laser deposition system 50, a target T is placed on a rotatable target holder 52 arranged in a vacuum chamber 53. When the target T is irradiated with laser light L emitted from a pulsed laser 51, a plasma plume P is produced along a direction approximately perpendicular to the surface of the target T, so that components of the target T are transformed into plasma or molecules and reach the substrate 11. Then, every time the target T is irradiated with a laser pulse, the atoms and molecules which reach the substrate 11 migrate on the substrate 11, and crystal nucleation and crystal growth occur on the substrate 11. That is, the crystal growth proceeds by repeating the irradiation of the target T with a laser pulse, so that a film 13 is formed on the substrate 11. In the case where the film 13 is an oxide film, it is necessary to maintain an atmosphere of a low oxygen partial pressure in the vacuum chamber 53 by using an oxygen introduction unit (which is connected to the vacuum chamber 53 through the inlet 54) and a pressure reduction unit (which is connected to the vacuum chamber 53 through the outlet 55). The characteristics and the crystal structure of the film vary with the plasmatic condition and the oxygen partial pressure.

The present inventors consider that since the Bi-based compounds have a high saturated vapor pressure and are therefore volatile, the vaporization of bismuth oxide affects the crystal growth, so that it is hard for the Bi-based compounds to form a perovskite structure. In particular, in the case where a film of a Bi-based perovskite oxide is formed on a Si substrate through an electrode exhibiting low gas-barrier characteristics such as a Pt/Ti electrode, vapored bismuth oxide reaches the Si substrate and reacts with Si, so that the bismuth oxide is likely to affect the crystal growth.

In addition, as mentioned before, every time the target T is irradiated with a laser pulse, the atoms and molecules which reach the substrate 11 migrate on the substrate 11, and crystal nucleation and crystal growth occur on the substrate 11. Therefore, if the laser pulse frequency is too high, the atoms can reach the substrate and deposit on the substrate before the atoms which previously reach the substrate and migrate on the substrate form a perovskite structure, so that a hetero phase can be produced. If the laser pulse frequency is too low, the film-formation rate is too low, so that the film cannot have a sufficient thickness. In particular, in the case where the amount of atoms of one or more elements such as Fe which can easily form a perovskite structure together with Bi is too small in the composition of the film, a hetero phase can be more likely to be produced.

Nevertheless, the present inventors have succeeded in forming perovskite structures of Bi-based compounds with compositions containing in the B sites a relatively small amount (e.g., less than 50%) of atoms of one or more elements which can easily form a perovskite structure together with Bi, by PLD, where vaporization of the Bi-based compounds are suppressed by optimizing the oxygen partial pressure, and the plasmatic condition is optimized by controlling the laser pulse frequency so as to reduce the proportion of hetero phases.

For example, the present inventors have formed a perovskite-oxide film of $Bi(Fe, Al)O_3$ having a single-phase perovskite structure on a Pt electrode under a condition that the oxygen partial pressure is 50 mTorr and the laser pulse frequency is 5 Hz, where the Pt electrode is formed through a Ti buffer layer on a Si monocrystalline substrate having a thermally oxidized film. The present inventors have confirmed the formation of the perovskite-oxide film of $Bi(Fe, Al)O_3$ having a single-phase perovskite structure by evaluation using XRD as explained later in the concrete examples 1 to 3.

That is, the perovskite-oxide films according to the present invention can be produced by controlling the oxygen partial pressure and the laser pulse frequency in PLD under such a condition that a Bi-based oxide can form a perovskite structure.

Although the thickness of the perovskite-oxide film according to the present invention is not specifically limited, the thickness may be 500 nanometers to tens of micrometers.

As explained above, the present invention provides a novel lead-free perovskite-oxide film which is superior in piezoelectric (ferroelectric) characteristics. According to the present invention, the lead-free perovskite-oxide film can be obtained by producing a solid solution of an oxide which can be easily formed to have a perovskite structure and a Bi-based oxide which is unable or hard to form, by itself at normal pressure, a perovskite structure having satisfactory crystallinity.

3. Piezoelectric Device and Inkjet Recording Head

Figure 2:
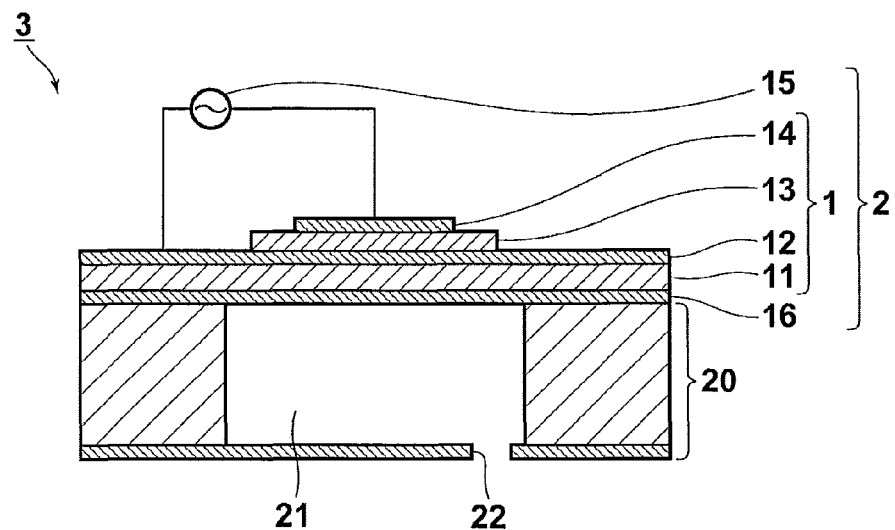
FIG. 2 is a cross-sectional view schematically illustrating a cross section of an essential portion of an inkjet recording head (as a liquid discharge device) having a piezoelectric device according to an embodiment of the present invention.

Hereinbelow, the structure of an inkjet recording head (as an embodiment of the liquid discharge device according to the fourth aspect of the present invention) containing a piezoelectric device (as an embodiment of the piezoelectric device according to the third aspect of the present invention) is explained with reference to FIG. 2, which is a cross-sectional view schematically illustrating a cross section (along the thickness direction) of an essential portion of the inkjet recording head. In FIG. 2, the dimensions of the illustrated elements are differentiated from the dimensions of the elements of the actual inkjet recording head for clarification.

In outline, the inkjet recording head 3 illustrated in FIG. 2 is constituted by a piezoelectric actuator 2 and an ink nozzle 20, and the piezoelectric actuator 2 is constituted by a piezoelectric device 1 and a diaphragm 16.

The piezoelectric device 1 is produced by forming on a substrate 11 a lower electrode 12, a ferroelectric (piezoelectric) film 13, and an upper electrode 14 in this order. The ferroelectric film 13 is a lead-free (Bi-based) perovskite-oxide film according to the present invention, which is superior in piezoelectric performance. An electric field along the thickness direction can be applied to the ferroelectric film 13 through the lower electrode 12 and the upper electrode 14.

As mentioned before, the substrate 11 is a substrate other than a monocrystalline perovskite substrate, as explained before for the formation of the lead-free (Bi-based) perovskite-oxide film (ferroelectric film) according to the present invention.

Although the main component of the lower electrode 12 is not specifically limited, the lower electrode 12 is an epitaxial film formed on the substrate 11 by epitaxial growth. In addition, preferably, the lower electrode 12 is such a film as to enable epitaxial growth of the ferroelectric film 13 on the lower electrode 12.

The main component of the upper electrode 14 is not specifically limited, and may be, for example, one or a combination of metals such as Au, Pt, and Ir and metal oxides such as $IrO_2$, $RuO_2$, $LaNiO_3$, and $SrRuO_3$. In addition, it is also possible to use the materials (such as Al, Ta, Cr, and Cu) which are commonly used for electrodes in the semiconductor processes.

Although the thicknesses of the lower electrode 12 and the upper electrodes 14 are not specifically limited, it is preferable that the thicknesses of the lower electrode 12 and the upper electrodes 14 be 50 to 500 nm. Although the thickness of the ferroelectric film 13 is not specifically limited, it is preferable that the thicknesses of the ferroelectric film 13 be 500 nm or more for realizing satisfactory piezoelectric performance.

The piezoelectric actuator 2 is produced by attaching the diaphragm 16 to the back surface of the substrate 11 of the piezoelectric device 1 so that the diaphragm 16 can vibrate in correspondence with expansion and contraction of the ferroelectric film 13. In addition, the piezoelectric actuator 2 comprises a control means 15 (such as a driver circuit) for driving the piezoelectric device 1.

The inkjet recording head 3 is produced by attaching the ink nozzle 20 to the back surface of the piezoelectric actuator 2. The ink nozzle 20 is a member for reserving and discharging ink, and comprises an ink chamber 21 (as the liquid-reserve chamber) and an ink-discharge outlet 22 (as the liquid-discharge outlet). The ink chamber 21 reserves the ink, and the ink held in the ink chamber 21 is discharged out of the ink chamber 21 through the corresponding ink-discharge outlet.

In the above inkjet recording head 3, the strength of the electric field applied to the piezoelectric device 1 is increased or decreased so as to expand or contract the piezoelectric device 1 and control the discharge of the ink from the ink chamber 21 and the discharge amount of the ink.

Alternatively, it is possible to machine or process portions of the substrate 11 so as to form the diaphragm 16 and the ink nozzle 20, instead of separately preparing the diaphragm 16 and the ink nozzle 20 and attaching the diaphragm 16 and the ink nozzle 20 to the piezoelectric device 1. For example, the ink chamber 21 can be formed by etching a corresponding portion of the substrate 11 from the bottom surface of the substrate 11, and the diaphragm 16 and the structures of the ink nozzle 20 can be produced by machining or processing the substrate 11 per se.

Since the piezoelectric device 1 illustrated in FIG. 2 comprises the perovskite-oxide film (ferroelectric film) 13 according to the present invention, the perovskite-oxide lamination 1 contains a perovskite oxide which is theoretically considered able to exhibit high piezoelectric performance and has been conventionally unable to be formed into a perovskite structure at normal pressure, is superior in the piezoelectric (ferroelectric) performance, and reduces the environmental load.

4. Inkjet Recording Apparatus

Figure 3:
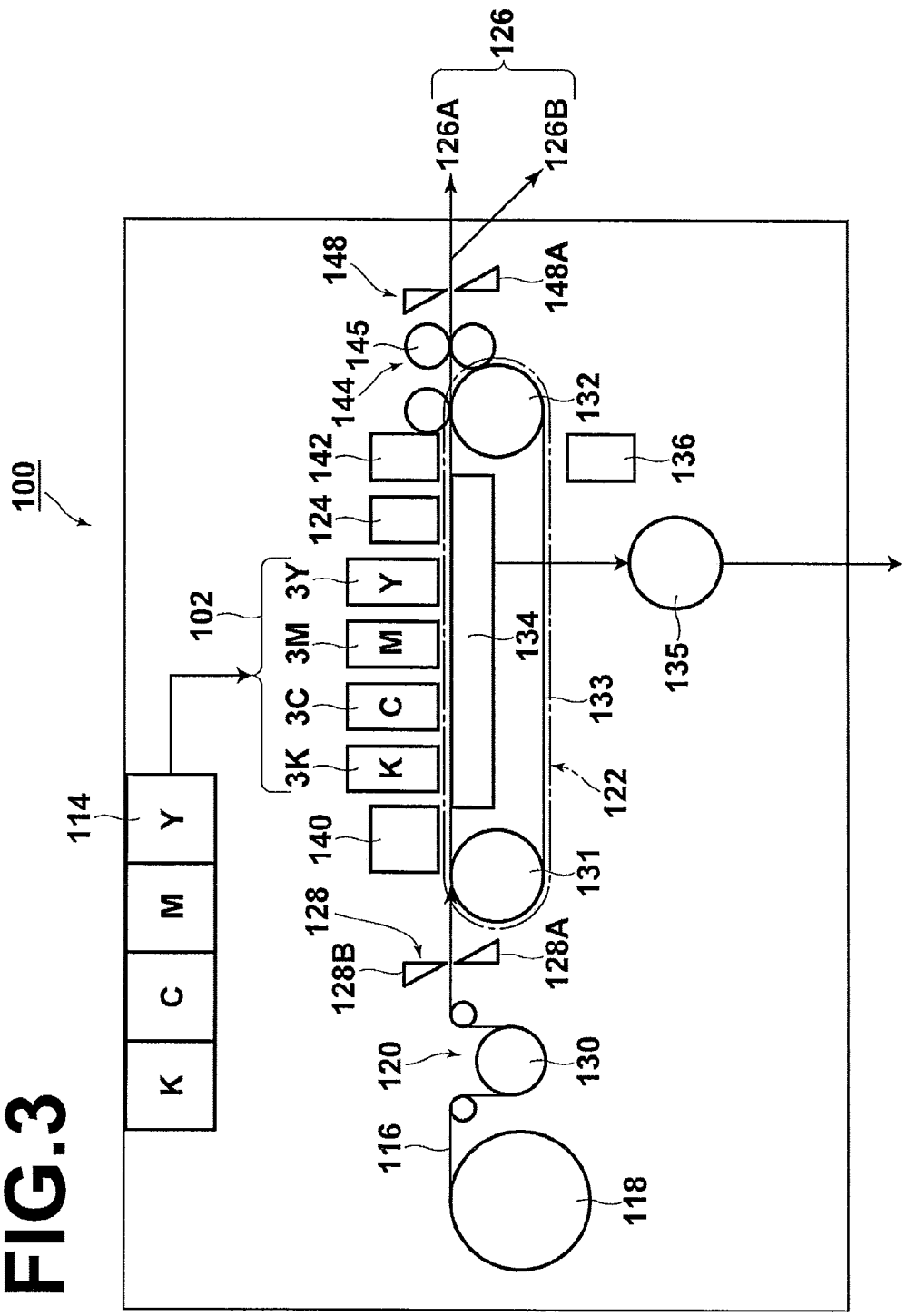
FIG. 3 is a schematic diagram of an example of an inkjet recording apparatus using the inkjet recording head of FIG. 2.
Figure 4:
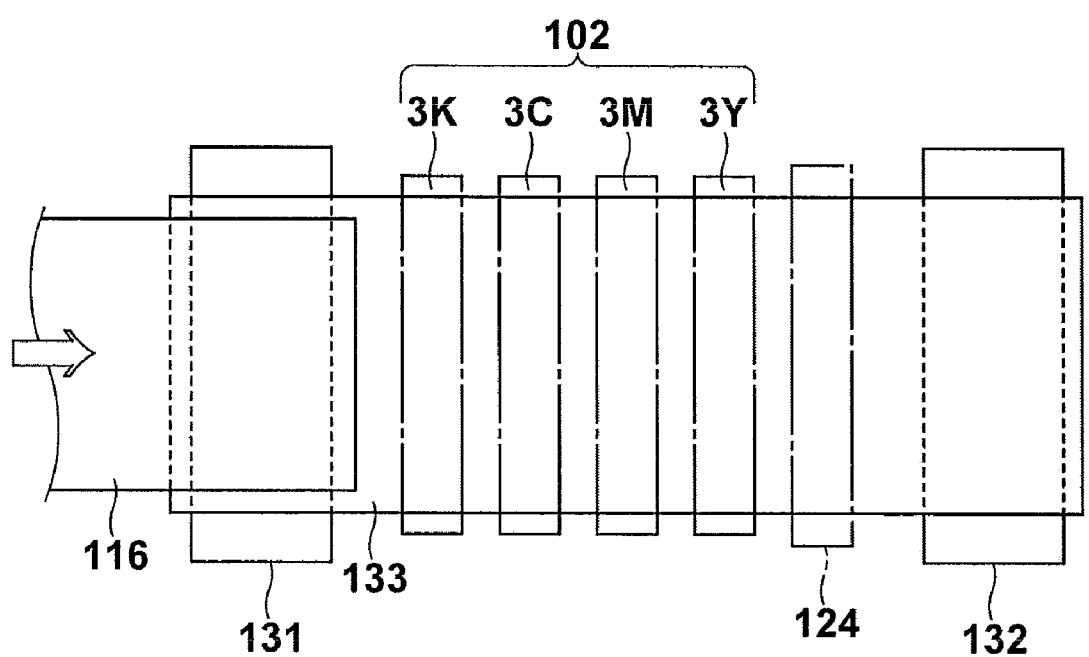
FIG. 4 is a top view of a portion of the inkjet recording apparatus of FIG. 3.

Hereinbelow, an example of an inkjet recording apparatus having the inkjet recording head 3 is explained with reference to FIGS. 3 and 4. FIG. 3 is a schematic diagram illustrating an outline of an example of an inkjet recording apparatus having the inkjet recording head 3 of FIG. 2, and FIG. 4 is a top view of a portion of the inkjet recording apparatus of FIG. 3.

As schematically illustrated in FIG. 3, the inkjet recording apparatus 100 comprises a printing unit 102, an ink reserve-and-load unit 114, a sheet feeding unit 118, a decurling unit 120, a suction-type belt conveyer 122, a print detection unit 124, and a sheet output unit 126. The printing unit 102 comprises a plurality of inkjet recording heads 3K, 3C, 3M, and 3Y corresponding to inks of different colors (specifically, black (K), cyan (C), magenta (M), and yellow (Y)). Hereinafter, the inkjet recording heads may be referred to as heads. The ink reserve-and-load unit 114 reserves the inks to be supplied to the heads 3K, 3C, 3M, and 3Y. The sheet feeding unit 118 feeds a recording sheet 116. The decurling unit 120 eliminates curl of the recording sheet 116. The suction-type belt conveyer 122 is arranged to face the nozzle faces (ink-discharge faces) of the printing unit 102, and conveys the recording sheet 116 while maintaining the flatness of the recording sheet 116. The print detection unit 124 reads an image printed on the recording sheet 116 by the printing unit 102. The sheet output unit 126 externally outputs a printed recording sheet 116.

Each of the heads 3K, 3C, 3M, and 3Y constituting the printing unit 102 corresponds to the inkjet recording head 3 according to the present embodiment as explained before. In order to realize a linear head (explained later), each inkjet recording head used in the inkjet recording apparatus 100 comprises a plurality of ink chambers and a plurality of ink-discharge outlets.

The decurling unit 120 performs decurling of the recording sheet 116 by heating the recording sheet 116 with a heating drum 130 so as to eliminate the curl produced in the sheet feeding unit 118.

In the case where the inkjet recording apparatus 100 uses roll paper, a cutter 128 for cutting the roll paper into desired size is arranged in the stage following the decurling unit 120 as illustrated in FIG. 3. The cutter 128 is constituted by a fixed blade 128A and a round blade 128B. The fixed blade 128A has a length equal to or greater than the width of the conveying path of the recording sheet 116, and is arranged on the side opposite to the print side of the recording sheet 116. The round blade 128B is arranged opposite to the fixed blade 128A on the print side of the recording sheet 116, and moves along the fixed blade 128A. In the inkjet recording apparatuses using cut paper, the cutter 128 is unnecessary.

After the roll paper is decurled and cut into the recording sheet 116, the recording sheet 116 is transferred to the suction-type belt conveyer 122. The suction-type belt conveyer 122 is constituted by rollers 131 and 132 and an endless belt 133. The rollers 131 and 132 are placed apart and the endless belt 133 is looped around the rollers 131 and 132 in such a manner that at least portions of the endless belt 133 which face the nozzle faces of the printing unit 102 and the sensor face of the print detection unit 124 are flat and horizontal.

The endless belt 133 has a width greater than the width of the recording sheet 116, and a great number of suction pores (not shown) are formed through the endless belt 133. A suction chamber 134 is arranged inside the loop of the endless belt 133 at the position opposite to the nozzle faces of the printing unit 102 and the sensor face of the print detection unit 124, and suctioned by a fan 135, so that a negative pressure is generated in the suction chamber 134, and the recording sheet 116 on the endless belt 133 is held by suction.

The power of a motor (not shown) is transmitted to at least one of the rollers 131 and 132 so that the endless belt 133 is driven clockwise in FIG. 3, and the recording sheet 116 held on the endless belt 133 is moved from left to right in FIG. 3.

In the case of borderless printing, ink can be deposited on the endless belt 133. Therefore, in order to clean the endless belt 133, a belt cleaning unit 136 is arranged at a predetermined (appropriate) position outside the loop of the endless belt 133 and the printing region.

A heating fan 140 is arranged on the upstream side of the printing unit 102 above the conveying path of the recording sheet 116 (which is realized by the suction-type belt conveyer 122). The heating fan 140 blows heated air to the recording sheet 116 before printing so as to heat the recording sheet 116 and facilitate drying of deposited ink.

Each of the heads 3K, 3C, 3M, and 3Y in the printing unit 102 is a so-called full-line type head, which is a linear head having a length corresponding to the maximum width of the recording sheet 116, and being arranged across the width of the recording sheet 116 (i.e., in the main scanning direction perpendicular to the feeding direction of the recording sheet 116) as illustrated in FIG. 4. Specifically, each of the heads 3K, 3C, 3M, and 3Y is a linear head in which the aforementioned plurality of ink-discharge outlets (nozzles) are arrayed over a length exceeding the maximum length of a side of the largest recording sheet 116 on which the inkjet recording apparatus 100 can print an image. The heads 3K, 3C, 3M, and 3Y corresponding to the inks of the different colors are arrayed upstream in this order along the feeding direction as illustrated in FIG. 4. Thus, a color image can be printed on the recording sheet 116 by discharging the inks of the different colors while conveying the recording sheet 116.

The print detection unit 124 may be constituted by, for example, a line sensor which takes an image formed of spots of the inks discharged from the printing unit 102, and detects, from the image taken by the line sensor, incomplete discharge, which can be caused by clogging of a nozzle or the like.

A rear drying unit 142 for drying the printed surface of the recording sheet 116 is arranged in the stage following the print detection unit 124. For example, the rear drying unit 142 is realized by a heating fan or the like. Since it is preferable to avoid contact with the printed surface before the ink on the printed surface is completely dried, it is preferable that the rear drying unit 142 dry the ink on the printed surface by blowing heated air.

In order to control the glossiness of the image printed on the recording sheet 116, a heating-and-pressurizing unit 144 is arranged in the stage following the rear drying unit 142. The heating-and-pressing unit 144 comprises pressure rollers 145 having a surface having predetermined projections and depressions, and transfers the predetermined projections and depressions to the printed surface of the recording sheet 116 by pressing the printed surface with the pressure rollers 145 while heating the printed surface.

Finally, the printed recording sheet 116 produced as above is outputted from the sheet output unit 126. It is preferable to separately output test prints and prints for practical use. Therefore, the sheet output unit 126 includes a first output unit 126A for the prints for practical use and a second output unit 126B for the test prints. Although not shown, the inkjet recording apparatus 100 further comprises a sorting unit which sorts the printed recording sheets 116 into the test prints and the prints for practical use, and sends the test prints to the first output unit 126B, and the prints for practical use to the second output unit 126A.

Further, in the case where both of a test image and an image for practical use are concurrently printed on a recording sheet 116, it is possible to arrange a cutter 148, and separate a first portion of the recording sheet 116 on which the test image is printed and a second portion of the recording sheet 116 on which the image for practical use is printed.

5. Evaluation of Concrete Examples

The present inventors have produced concrete examples 1 to 4 of the perovskite-oxide film according to the present invention and a comparison example as indicated below.

5.1 Concrete Example 1

The concrete example 1 of the perovskite-oxide film according to the present invention has been produced as follows.

First, a Ti adhesion layer having a thickness of 20 nm and a (111) Pt lower electrode having a thickness of 200 nm have been formed in this order on a (100) Si monocrystalline substrate having a thermally oxidized film, by sputtering at the substrate temperature of 350° C. Then, a thin (piezoelectric) film of $BiFe_{0.3}Al_{0.7}O_3$ having a thickness of 700 nm has been formed on the lower electrode by performing PLD using a target of $Bi_{1.1}Fe_{0.3}Al_{0.7}O_3$ for 100 minutes under the condition that the laser intensity is 300 mJ, the laser pulse frequency is 5 Hz, the oxygen partial pressure is 50 mTorr, the distance between the substrate and the target is 50 mm, the rotation speed of the target is 9.7 rpm, and the substrate temperature is 585° C.

Figure 5:
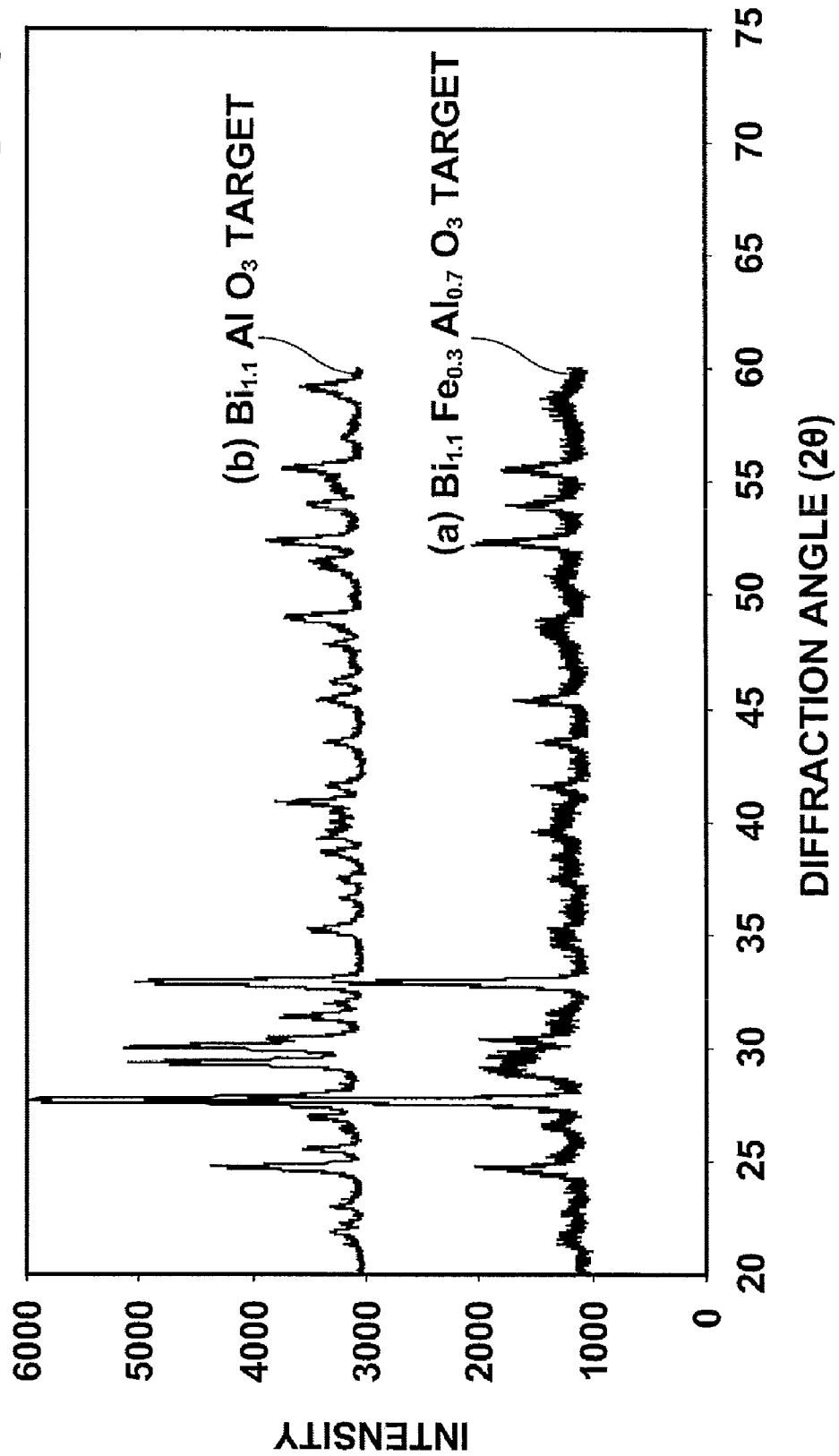
FIG. 5 is a graph indicating an XRD profile of a target for film formation in a concrete example 1 and an XRD profile of a target for film formation in a comparison example 1.
Figure 6:
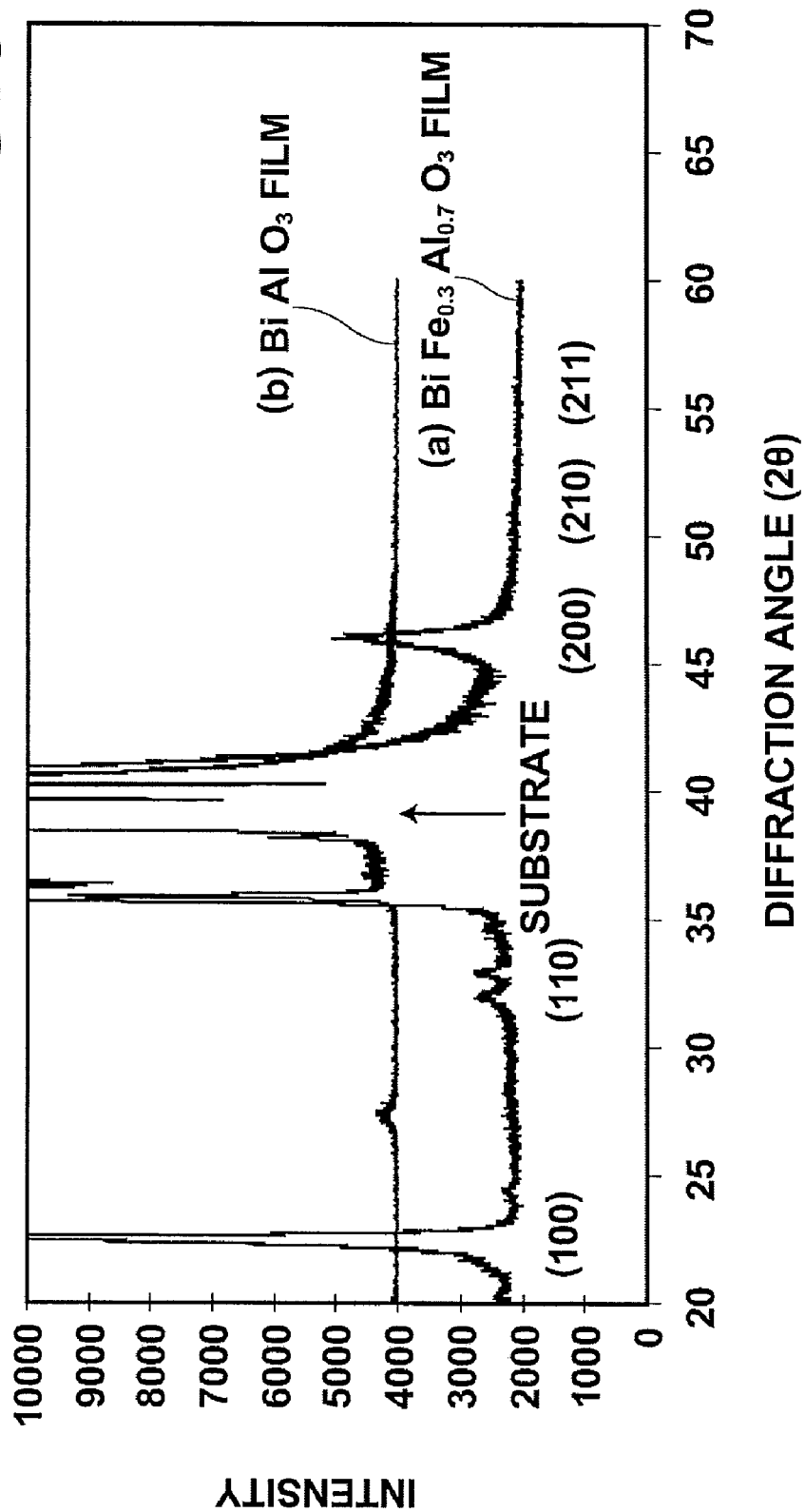
FIG. 6 is a graph indicating an XRD profile of a $BiFe_{0.3}Al_{0.7}O_3$ film in the concrete example 1 and an XRD profile of an XRD profile of a $BiAlO_3$ film in the comparison example 1.

Thereafter, the target of $Bi_{1.1}Fe_{0.3}Al_{0.7}O_3$ and the piezoelectric film of $BiFe_{0.3}Al_{0.7}O_3$ have been evaluated by XRD (X-ray diffraction) measurement. The results of the XRD measurement of the target and the piezoelectric film are indicated by the XRD profiles (a) in FIGS. 5 and 6, respectively. Although no peak corresponding to a perovskite structure has been observed in the XRD profile (a) of the target indicated in FIG. 5, a single-phase perovskite structure which is preferentially oriented along the (100) direction has been observed in the XRD profile (a) of the piezoelectric film indicated in FIG. 6.

5.2 Concrete Example 2

Four perovskite-oxide films 2-1, 2-2, 2-3, and 2-4 of $BiFeAlO_3$ according to the present invention having different compositions have been produced in the concrete example 2 in a similar manner to the concrete example 1 except that targets of $Bi_{1.1}Fe_{0.1}Al_{0.9}O_3$, $Bi_{1.1}Fe_{0.4}Al_{0.6}O_3$, $Bi_{1.1}Fe_{0.5}Al_{0.5}O_3$, and $Bi_{1.1}Fe_{0.7}Al_{0.3}O_3$ have been respectively used for formation of the four perovskite-oxide films.

Thereafter, each of the perovskite-oxide films 2-1, 2-2, 2-3, and 2-4 produced as above has been evaluated by XRD measurement, and has been confirmed to have a single-phase perovskite structure which is preferentially oriented along the (100) direction.

5.3 Concrete Example 3

The concrete example 3 of the perovskite-oxide film according to the present invention has been produced as follows.

First, a lower electrode of (100)-oriented $SrRuO_3$ having a thickness of 200 nm has been formed by PLD through a MgO film having a thickness of 20 nm on a (100) Si monocrystalline substrate. Then, a thin (piezoelectric) film of $BiFe_{0.9}Co_{0.1}O_3$ having a thickness of 300 to 400 nm has been formed on the lower electrode by performing PLD using a target of $Bi_{1.1}Fe_{0.9}Co_{0.1}O_3$ for 100 minutes under the condition that the laser intensity is 350 mJ, the laser pulse frequency is 5 Hz, the oxygen partial pressure is 50 mTorr, the distance between the substrate and the target is 50 mm, the rotation speed of the target is 9.7 rpm, and the substrate temperature is 585° C.

Thereafter, the piezoelectric film of $BiFe_{0.9}Co_{0.1}O_3$ has been evaluated by XRD measurement. The result of the XRD measurement of the piezoelectric film is indicated in FIG. 7.

Figure 7:
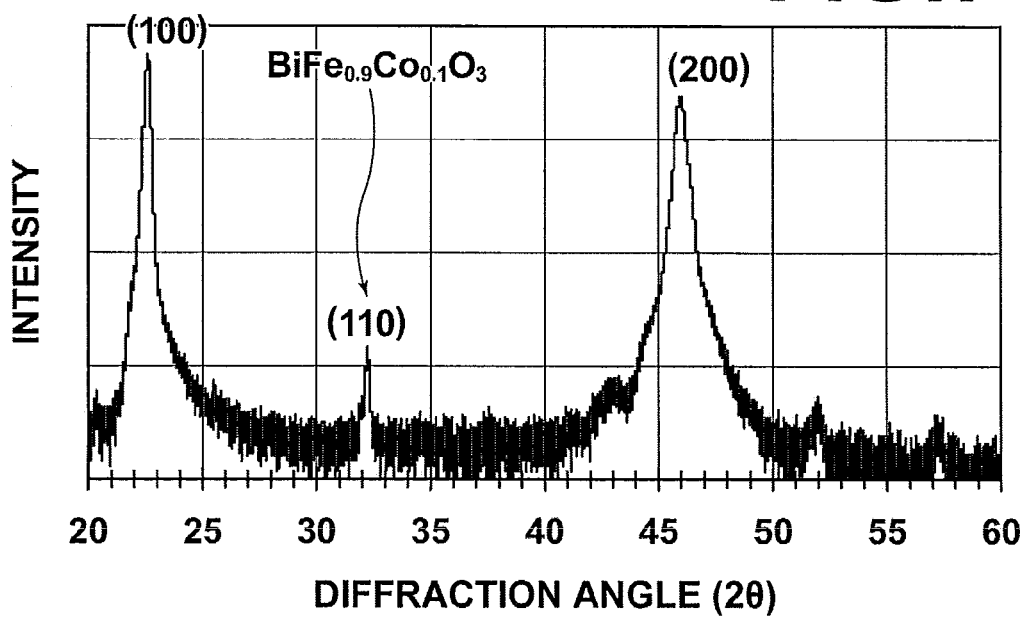
FIG. 7 is a graph indicating an XRD profile of a $BiFe_{0.9}Co_{0.1}O_3$ film in a concrete example 3.

As indicated in FIG. 7, a single-phase perovskite structure which is preferentially oriented along the (110) direction has been observed in the XRD profile indicated in FIG. 7.

5.4 Concrete Example 4

Figure 8:
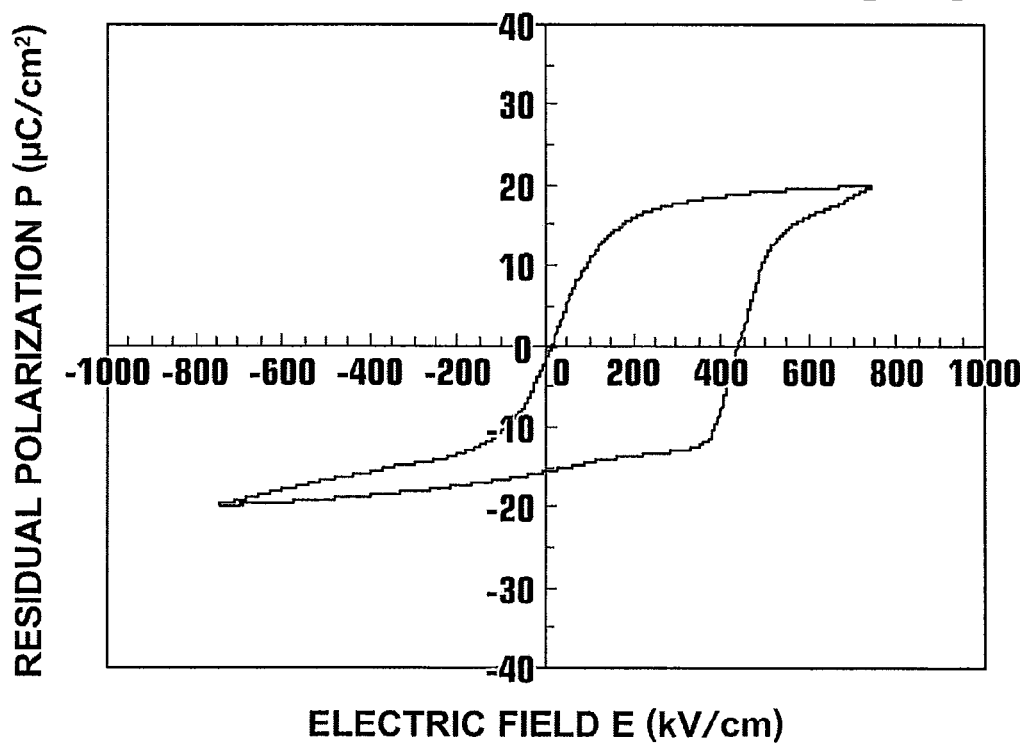
FIG. 8 is a graph indicating a P-E hysteresis characteristic of a $BiFe_{0.855}Co_{0.095}Mn_{0.05}O_3$ film in a concrete example 4.

The concrete example 4 of the perovskite-oxide film according to the present invention has been produced in a similar manner to the concrete example 3 except that a thin (piezoelectric) film of $BiFe_{0.855}Co_{0.095}Mn_{0.05}O_3$ having a thickness of 300 to 400 nm has been formed by using a target of $BiFe_{0.855}Co_{0.095}Mn_{0.05}O_3$. (That is, the piezoelectric film in the concrete example 4 is doped with a very small amount of Mn.) Thereafter, the bipolar polarization-electric field characteristic (P-E hysteresis characteristic) of the piezoelectric film of $BiFe_{0.855}Co_{0.095}Mn_{0.05}O_3$ has been measured by applying an electric field to the piezoelectric film, where the measurement frequency is 10 KHz, the maximum applied electric field strength is 800 kV/cm, and the measurement temperature is 80K. The obtained P-E hysteresis characteristic is indicated in FIG. 8. That is, satisfactory piezoelectricity of the above piezoelectric film has been confirmed.

5.5 Comparison Example

As the comparison example, a thin film of $BiAlO_3$ having a thickness of 700 nm has been formed in a similar manner to the concrete example 1 except that a target of $Bi_{1.1}AlO_3$ is used.

Thereafter, the target of $Bi_{1.1}AlO_3$ and the thin $BiAlO_3$ film have been evaluated by XRD (X-ray diffraction) measurement. The results of the XRD measurement of the $Bi_{1.1}AlO_3$ target and the thin $BiAlO_3$ film are indicated by the XRD profiles (b) in FIGS. 5 and 6, respectively. No peak corresponding to a perovskite structure has been observed in either of the XRD profiles (b) of the $Bi_{1.1}AlO_3$ target and the thin $BiAlO_3$ film. That is, no perovskite structure has been formed in the $BiAlO_3$ film in the comparison example.

The crystal structures of the films obtained in the concrete examples 1, 2, 3, and 4, and the comparison example are summarized in Table 2 together with the crystal structures of bulk bodies having the same compositions as the concrete examples 1, 2, 3, and 4, and the comparison example.

TABLE 2

| | Film Composition | Bulk Crystal Structure | Thin-film Crystal Structure |
|---|---|---|---|
| Comparison Example | $BiAlO_3$ | Non-perovskite | Non-perovskite |
| Concrete Example 2-1 | $Bi(Fe_{0.1}Al_{0.9})O_3$ | Non-perovskite | Perovskite |
| Concrete Example 1 | $Bi(Fe_{0.3}Al_{0.7})O_3$ | Non-perovskite | Perovskite |
| Concrete Example 2-2 | $Bi(Fe_{0.4}Al_{0.6})O_3$ | Non-perovskite | Perovskite |
| Concrete Example 2-3 | $Bi(Fe_{0.5}Al_{0.5})O_3$ | Non-perovskite | Perovskite |
| Concrete Example 2-4 | $Bi(Fe_{0.7}Al_{0.3})O_3$ | Non-perovskite | Perovskite |
| Concrete Example 3 | $Bi(Fe_{0.9}Co_{0.1})O_3$ | Non-perovskite | Perovskite |
| Concrete Example 4 | $Bi(Fe_{0.895}Co_{0.095}Mn_{0.05})O_3$ | Non-perovskite | Perovskite |

6. Industrial Usability

The ferroelectric films according to the present invention can be preferably used in piezoelectric actuators, where the piezoelectric actuators may be mounted in the inkjet recording heads, the magnetic recording-and-reproduction heads, MEMS (micro electromechanical systems) devices, micropumps, ultrasonic probes, and the like. In addition, the ferroelectric films according to present invention can also be preferably used in ferroelectric devices (e.g., ferroelectric memories).

What is claimed is:

1. A film being formed on a substrate which has a structure different from a monocrystalline perovskite structure, and containing a piezoelectric oxide which has a composition expressed by a compositional formula, $A(B_xC_{1-x})O_3$, other than $Bi(Fe_yCs_{1-y})O_3$ and $Bi(Fe, Co)O_3$, where $0<x<1.0, 0.5 \leq y \leq 0.9$, each of A, B, and C represents one or more metallic elements, A represents one or more A-site elements including Bi as a main component, B and C represent B-site elements, B represents one or more B-site elements including as a main component one or more elements which can constitute a perovskite structure together with the one or more A-site elements represented by A, C represents one or more B-site elements which are unable or hard to constitute a perovskite structure together with the one or more A-site elements represented by A, and the ratio of each of the total molar amount of the one or more A-site elements and the total molar amount of the B-site elements to the molar amount of oxygen may deviate from 1:3 within a range in which the composition expressed by the compositional formula $A(B_xC_{1-x})O_3$ can form a perovskite structure.

2. A film being formed on a substrate which has a structure different from a monocrystalline perovskite structure, having an epitaxial or oriented structure, and containing a piezoelectric oxide which has a composition expressed by a compositional formula, $A(B_xC_{1-x})O_3$, where $0<x<1.0$, each of A, B, and C represents one or more metallic elements, A represents one or more A-site elements including Bi as a main component, B and C represent B-site elements, B represents one or more B-site elements including as a main component one or more elements which can constitute a perovskite structure together with the one or more A-site elements represented by A, C represents one or more B-site elements which are unable or hard to constitute a perovskite structure together with the one or more A-site elements represented by A, and the ratio of each of the total molar amount of the one or more A-site elements and the total molar amount of the B-site elements to the molar amount of oxygen may deviate from 1:3 within a range in which the composition expressed by the compositional formula $A(B_xC_{1-x})O_3$ can form a perovskite structure.

3. A film according to claim 1, being formed over said substrate via one of one or more buffer layers and a lower electrode which enable epitaxial growth of said film on the one of the buffer layer and the lower electrode.

4. A film according to claim 2, being formed over said substrate via one of one or more buffer layers and a lower electrode which enable epitaxial growth of said film on the one of the buffer layer and the lower electrode.

5. A film according to claim 1, wherein said one or more B-site elements represented by B include as at least one main component at least one of Fe, Mn, and Cr.

6. A film according to claim 2, wherein said one or more B-site elements represented by B include as at least one main component at least one of Fe, Mn, and Cr.

7. A film according to claim 1, wherein said one or more B-site elements represented by C include as at least one main component at least one trivalent metallic element.

8. A film according to claim 2, wherein said one or more B-site elements represented by C include as at least one main component at least one trivalent metallic element.

9. A film according to claim 1, wherein said one or more B-site elements represented by C are one or more of Al, Ga, Sc, and Co.

10. A film according to claim 2, wherein said one or more B-site elements represented by C are one or more of Al, Ga, Sc, and Co.

11. A film according to claim 1, further containing such an amount of atoms of one or more dopant elements of Mn, Cu, and Nb that said film can have a perovskite structure.

12. A film according to claim 2, further containing such an amount of atoms of one or more dopant elements of Mn, Cu, and Nb that said film can have a perovskite structure.

13. A film according to claim 1, having a composition at or near a morphotropic phase boundary.

14. A film according to claim 2, having a composition at or near a morphotropic phase boundary.

15. A film according to claim 1, being a piezoelectric film.

16. A film according to claim 2, being a piezoelectric film.

17. A film according to claim 15, being a ferroelectric film.

18. A film according to claim 16, being a ferroelectric film.

19. A film according to claim 15, containing a ferroelectric phase which has crystal orientation.

20. A film according to claim 16, containing a ferroelectric phase which has crystal orientation.

21. A film according to claim 19, containing at least one ferroelectric phase, where each of the at least one ferroelectric phase has a spontaneous polarization axis along a first direction and crystal orientation along a second direction different from the first direction.

22. A film according to claim 20, containing at least one ferroelectric phase, where each of the at least one ferroelectric phase has a spontaneous polarization axis along a first direction and crystal orientation along a second direction different from the first direction.

23. A film according to claim 21, wherein each of said at least one ferroelectric phase is at least one of a rhombohedral phase having crystal orientation along approximately a <100> direction, a rhombohedral phase having crystal orientation along approximately a <110> direction, a tetragonal phase having crystal orientation along approximately a <110> direction, a tetragonal phase having crystal orientation along approximately a <111> direction, an orthorhombic phase having crystal orientation along approximately a <100> direction, and an orthorhombic phase having crystal orientation along approximately a <111> direction.

24. A film according to claim 22, wherein each of said at least one ferroelectric phase is at least one of a rhombohedral phase having crystal orientation along approximately a <100> direction, a rhombohedral phase having crystal orientation along approximately a <110> direction, a tetragonal phase having crystal orientation along approximately a <110> direction, a tetragonal phase having crystal orientation along approximately a <111> direction, an orthorhombic phase having crystal orientation along approximately a <100> direction, and an orthorhombic phase having crystal orientation along approximately a <111> direction.

25. A film according to claim 21, wherein at least a portion of said each of the at least one ferroelectric phase transitions to a ferroelectric phase corresponding to a crystal system different from a crystal system corresponding to said each of the at least one ferroelectric phase, when an electric field is applied to said piezoelectric body along a direction different from said first direction.

26. A film according to claim 22, wherein at least a portion of said each of the at least one ferroelectric phase transitions to a ferroelectric phase corresponding to a crystal system different from a crystal system corresponding to said each of the at least one ferroelectric phase, when an electric field is applied to said piezoelectric body along a direction different from said first direction.

27. A piezoelectric device comprising:
said film according to claim 15; and
electrodes arranged to apply an electric field to the film.

28. A piezoelectric device comprising:
said film according to claim 16; and
electrodes arranged to apply an electric field to the film.

29. A piezoelectric device comprising:
said film according to claim 21; and
electrodes arranged to apply an electric field to the film along a direction different from said first direction.

30. A piezoelectric device comprising:
said film according to claim 22; and
electrodes arranged to apply an electric field to the film along a direction different from said first direction.

31. A liquid discharge device comprising:
said piezoelectric device according to claim 27; and a discharge member being arranged adjacent to the piezoelectric device, and including,
a liquid-reserve chamber which reserves liquid, and
a liquid-discharge outlet arranged to externally discharge said liquid in response to application of an electric field to said piezoelectric film in the piezoelectric device.

32. A liquid discharge device comprising:
said piezoelectric device according to claim 28; and a discharge member being arranged adjacent to the piezoelectric device, and including,
a liquid-reserve chamber which reserves liquid, and
a liquid-discharge outlet arranged to externally discharge said liquid in response to application of an electric field to said piezoelectric film in the piezoelectric device.

* * * * *

UNITED STATES PATENT AND TRADEMARK OFFICE
CERTIFICATE OF CORRECTION

PATENT NO. : 8,151,727 B2
APPLICATION NO. : 12/414125
DATED : April 10, 2012
INVENTOR(S) : Tsutomu Sasaki et al.

It is certified that error appears in the above-identified patent and that said Letters Patent is hereby corrected as shown below:

ON THE TITLE PAGE:

At item (30), correct the Foreign Application Priority Data to read as follows:

-- Mar. 31, 2008     (JP) ................................ 2008-090001
    Feb. 4, 2009     (JP) ................................ 2009-023383 --.

Signed and Sealed this
Twenty-eighth Day of August, 2012

David J. Kappos
*Director of the United States Patent and Trademark Office*